(12) United States Patent
Nakasugi et al.

(10) Patent No.: US 6,376,136 B1
(45) Date of Patent: Apr. 23, 2002

(54) CHARGED BEAM EXPOSURE METHOD

(75) Inventors: Tetsuro Nakasugi, Yokohama; Yuichiro Yamazaki, Tokyo; Hideaki Abe, Hachioji, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/465,932

(22) Filed: Dec. 17, 1999

(30) Foreign Application Priority Data

Dec. 18, 1998 (JP) ............................ 10-360714

(51) Int. Cl.$^7$ ............... G03F 9/00; G03C 5/00
(52) U.S. Cl. .............. 430/22; 430/30; 430/296; 430/942
(58) Field of Search ............... 430/22, 30, 296, 430/942

(56) References Cited

U.S. PATENT DOCUMENTS 5,607,801 A    3/1997 Nozue ........................ 430/22

FOREIGN PATENT DOCUMENTS

| JP | 63-263720 | 10/1988 |
| JP | 2-37710   | 2/1990  |
| JP | 7-169665  | 7/1995  |

OTHER PUBLICATIONS

Chang, L.P. et al., "Arrayed Miniature Electron Beam Columns For High Throughput Sub–100 nm Lithograph", J.Vac. Sci. Technol. B10(6), pp. 2743–2748 (1992).

Charge–reducing Effect of Chemically Amplified Resist with Ionized Photo Acid Generator, The 45$^{th}$ Symposium on Applied Physics—Compendium of Presentation Abstracts, Tokyo Engineering University, p. 662 (1998).

*Primary Examiner*—Christopher G. Young
(74) *Attorney, Agent, or Firm*—Finnegan, Henderson, Farabow, Garrett, & Dunner, L.L.P.

(57) ABSTRACT

A charged beam exposing method comprises a step of applying a voltage to a sample to thereby form an acceleration electric field on the sample, a step of accelerating an electron beam emitted from an electron gun and scanning an alignment mark formed on the sample with the electron beam, a step of detecting back-scattered electrons and secondary electrons, generated from the alignment mark, by means of a detector, a step of acquiring the position of the alignment mark based on a signal waveform detected, a step of eliminating or reducing the acceleration electric field by changing the applied voltage to the sample, and a step of exposing a pattern with the electron beam emitted from the electron gun based on information of the position of the alignment mark.

13 Claims, 12 Drawing Sheets

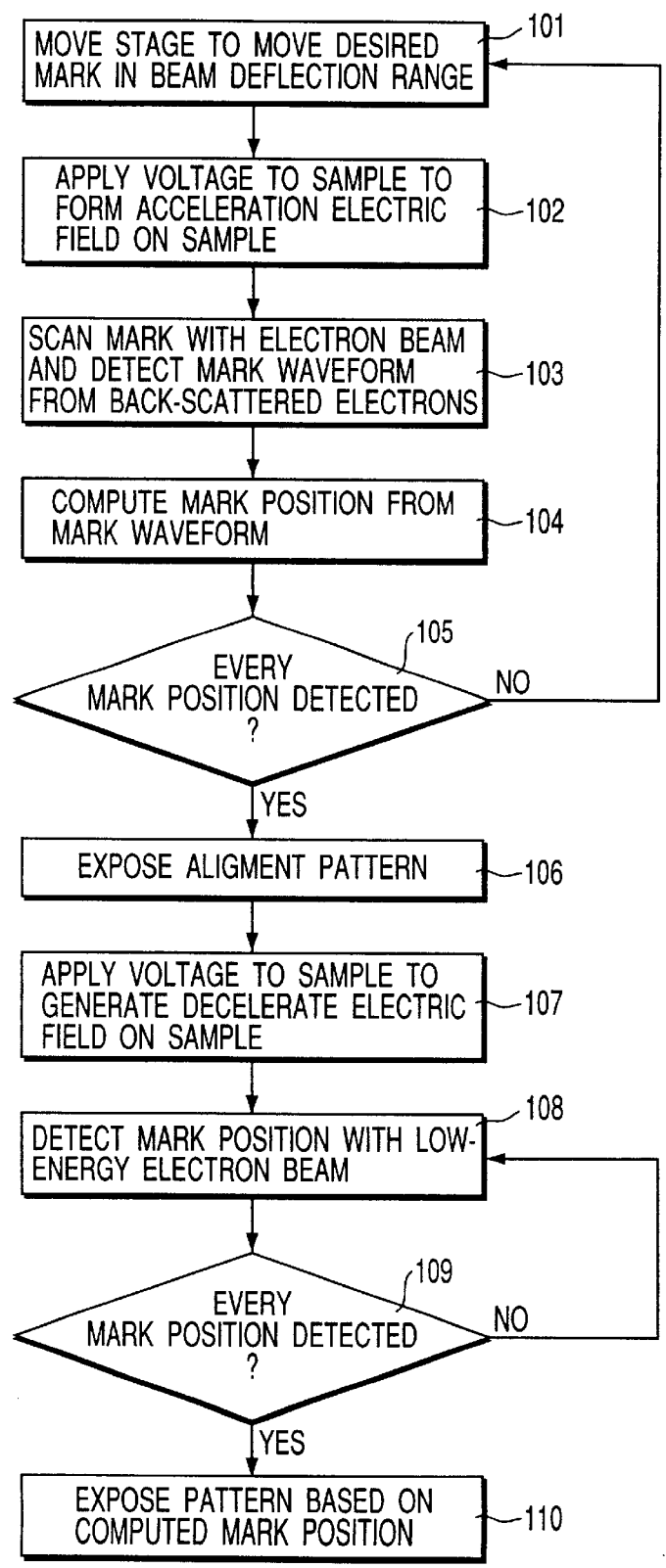
F I G. 15

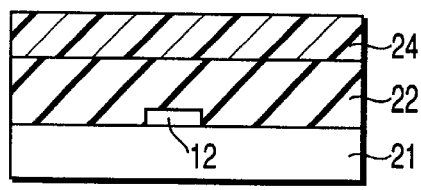
F I G. 19
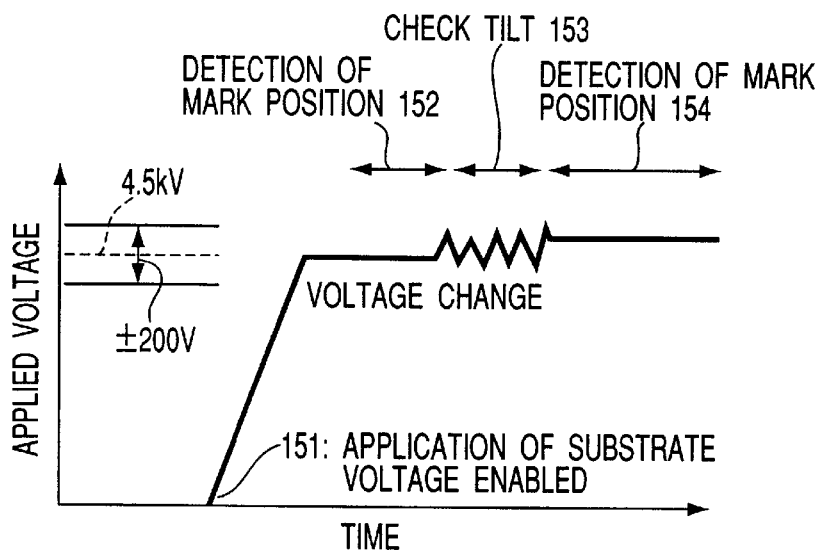
F I G. 21
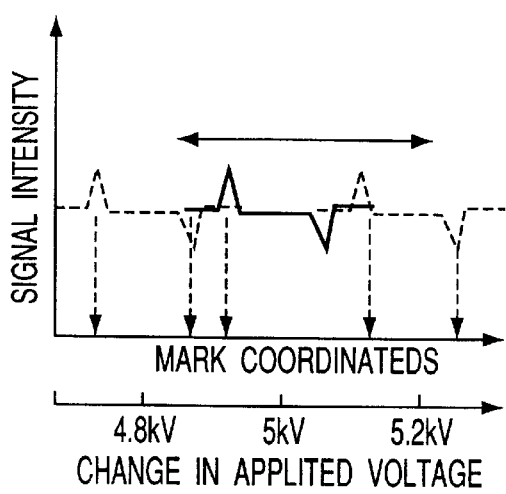
F I G. 22

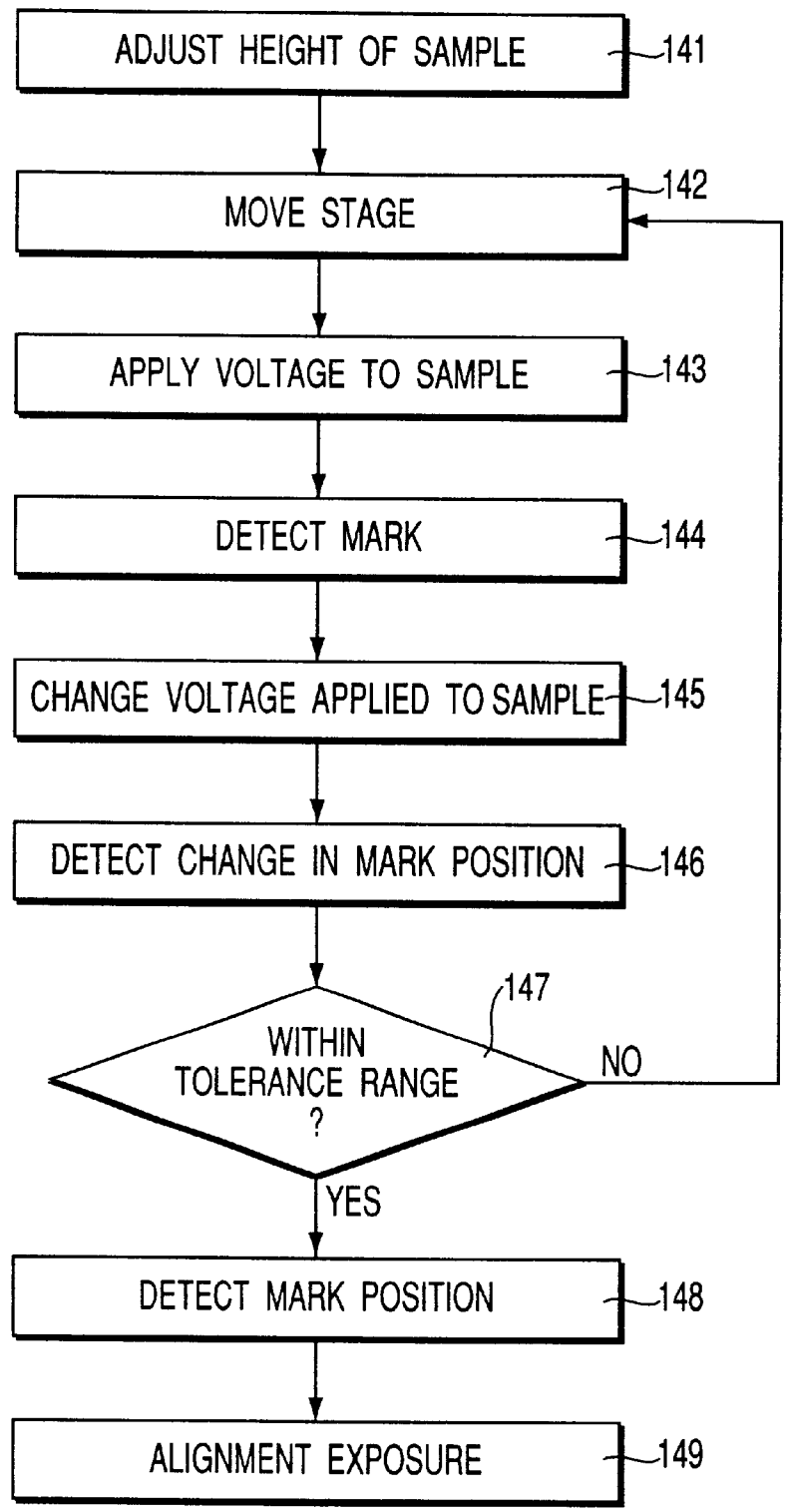
F I G. 20

CHARGED BEAM EXPOSURE METHOD

BACKGROUND OF THE INVENTION

The present invention relates to a charged beam exposure method and charged beam exposure apparatus, and, more particularly, to a charged beam exposure method and charged beam exposure apparatus for use in aligned exposure.

A typical alignment method to be used in exposure using a charged beam, for example, an electron beam is to scan a mark formed on the base substrate with a fast-accelerated electron beam and detect back-scattered electrons or secondary electrons from the mark. This mark for alignment is formed in a step structure or formed of materials with different back-scattered electron emission efficiencies.

Recently, studies are being made on exposure with a low-energy electron beam of 1 to 2 kV because it provides enhanced resist sensitivity and lower proximity effect and is difficult to cause charge-up (see, for example, J. Vac. Sci. Technol. 10 (1992) 2743, "Arrayed miniature electron beam columns for high throughput sub-100 nm lithography" by H. P. Chang et al.). Such a low-energy electron beam however has a poor penetration capability.

The problem that arises from mark detection using a low-energy electron beam will be discussed below referring to FIG. 1. As shown in FIG. 1, a sample has a lamination structure of an Si substrate 21, an Si oxide film 22 and a resist 24. An alignment mark 12 is formed on the Si substrate 21 deep from the surface of the resist 24. When a low-energy electron beam 10 is used, the electron beam 10 does not reach the alignment mark 12 formed deep from the surface of the resist 24, so that a back-scattered electron signal cannot be acquired. While there has been proposed provision of separate electron beam sources respectively for mark detection and exposure (e.g., Jpn. Pat. Appln. KOKAI Publication No. Hei 2-37710, Jpn. Pat. Appln. KOKAI Publication No. Hei 7-169665 and Jpn. Pat. Appln. KOKAI Publication No. Sho 63-263720), this approach makes the exposure apparatus complex.

As a solution to the problem that a back-scattered electron signal cannot be acquired, a mark detection method as illustrated in FIG. 2 is proposed. As shown in FIG. 2, this method scans only a resist surface 182 with the electron beam 10 to charge up the resist surface 182 so that the image of the alignment mark 12 is seen as secondary electrons 183.

This method utilizes the fact that there is a contrast between a capacitance 184 applied to the insulating film above the mark 12 differs from that in the other region, which makes the secondary electron emission efficiency directly above the mark 12 different from that on the other region. FIGS. 3A and 3B show the pattern image and waveform of the alignment mark 12 detected by this method. FIG. 3A is a top view of the pattern image of the alignment mark 12, and FIG. 3B shows the detected waveform of the pattern image. Although this method has been discussed with reference to an example wherein the resist film is used as the insulating film, an Si oxide film or the like may be used as the insulating film without changing the effect.

This mark detection method however has the following shortcomings. In a case of performing electron beam exposure on an insulating film like a resist, charge-up may cause misalignment of the beam. Conventionally, to eliminate this charge-up, a conductive film 201 was formed under (or on) the resist 24 as shown in FIG. 4. Here, the conductive film 201, like the Si substrate 21, is grounded to an earth 7. In such a case, no charge-up occurs, thus ensuring electron beam exposure without misalignment. Because the whole conductive film 201 has the same potential, however, there is no capacitance contrast between a region above the alignment mark 12 and the other region. This makes it difficult to detect the image of the alignment mark 12.

Further, inclination of a sample to the objective lens lowers the precision of alignment. FIG. 5 is a diagram for explaining this problem. FIG. 5 shows a case where a sample 2 is tilted with respect to, for example, an objective lens 211 at the time a voltage is applied to the sample 2. In this case, an electric field 212 between the sample 2 and the objective lens 211 become non-uniform, changing the traveling path of the electron beam 10.

As apparent from the above, the conventional exposure method using a low-energy electron beam suffers a low penetration capability of the electron beam, which makes it difficult to ensure high-precision alignment exposure with a simple system structure. With regard to the mark detection scheme which utilizes the capacitance contrast, when a conductive film is formed on or under the resist to prevent charge-up of the resist, the alignment mark cannot be detected. When the traveling direction of the electron beam deviates from the inclination of the surface of the sample, it is difficult to perform high-precision alignment.

BRIEF SUMMARY OF THE INVENTION

Accordingly, it is an object of the present invention to provide a charged beam exposure method which can accomplish high-precision alignment and pattern exposure with a simple structure.

It is another object of this invention to provide a charged beam exposure apparatus which can accomplish high-precision alignment and pattern exposure with a simple structure.

According to a first aspect of the invention, there is provided a charged beam exposing method comprising the steps of: applying a first voltage for accelerating a charged beam, emitted toward a sample by a charge-particle irradiating section, more than is accomplished by application of a reference exposure voltage to the sample and scanning an alignment mark formed in the sample with the charged beam to thereby acquire a position of the alignment mark; and applying the reference exposure voltage to the sample to carry out pattern exposure with the charged beam emitted from the charge-particle irradiating section.

According to a second aspect of the invention, there is provided A charged beam exposing method comprising: a first step of applying a voltage different from a reference exposure voltage to a sample; a second step of scanning the sample with a charged beam to thereby detect a position of an alignment mark formed in the sample; a third step of changing an applied voltage to the sample; a fourth step of detecting an amount of change in the position of the alignment mark caused by a change in the applied voltage; and a fifth step of adjusting a tilt of the sample based on the amount of change in the position of the alignment mark.

According to a third aspect of the invention, there is provided A charged beam exposing apparatus comprising: an charge-particle irradiating mechanism irradiating a charged beam to a sample; a voltage applying mechanism selectively applying a voltage for accelerating the charged beam to the sample at a time of alignment exposure; and a mark position detecting mechanism detecting charge particles from the sample generated by irradiation of the charged beam in the alignment exposure to thereby detect a position of an alignment mark formed in the sample.

According to this invention, an acceleration electric field is generated on the surface of a sample by applying a voltage to the sample and an alignment mark is detected using the accelerated charged beam. Even if a low-energy charged beam is used, therefore, the mark located deep from the sample surface can be detected. Further, even in which case where a conductive film is formed under the resist, high-precision detection of the alignment mark is possible which was difficult according to the conventional alignment method using a low-energy electron beam. Further, as charged beam exposure is carried out at a slower acceleration than mark detection, it brings about such advantages as suppression of the proximity effect by the slow-accelerated charged beam exposure apparatus and prevention of charge-up. Furthermore, alignment with the fast-accelerated beam and exposure with slow-accelerated beam can be switched from one to the other in response to a variation in the voltage applied to the sample. Therefore, this exposure apparatus does not require a separate fast-accelerated charge-particle irradiating mechanism and thus has a simple structure.

At the time of detecting the alignment mark, different acceleration voltages are applied to a sample, the deviation of the alignment mark on each applied voltage is detected and the mark position on a reference exposure voltage is calculated. Even if the sample is tilted to the objective lens in the charge-particle irradiating section, therefore, the mark position with the inclination corrected is acquired to ensure alignment exposure at higher precision.

In addition, alignment with the same energy from the charge-particle irradiating section as used in the actual pattern exposure becomes possible by exposing an alignment pattern on a sample with a fast-accelerated beam and scanning this alignment pattern with a slow-accelerated beam. When the sample is tilted to the objective lens, therefore, it is possible to avoid deviation of the beam caused by a difference between the acceleration voltage at the time of alignment and the one at the time of pattern exposure.

It is also possible to measure misalignment of an exposure pattern prior to development of the resist, by exposing a desired pattern after exposing an alignment pattern and obtaining a relative positional deviation between those alignment pattern and the desired pattern. This can guarantee selection of those samples which meet the allowable precision prior to development and can eliminate a wasteful process, thus leading to an improved productivity.

Further, a charged beam exposure apparatus, which detects the position of the mark and carries out pattern exposure with a voltage applied to a sample, can detect the inclination of the sample to the objective lens or a non-uniform electric field between the sample and the objective lens by detecting a change in mark position caused by varying the applied voltage to the sample.

Furthermore, after the change in mark position is detected, the inclination of the sample surface is readjusted so that a change in mark position, when the applied voltage to the sample is changed, falls within a tolerance range. Accordingly, it is possible to correct the tilt of the sample surface and a non-uniform electric field between the sample and the objective lens. As a result, the tilt of the sample surface is adjusted to ensure high-precision pattern exposure. Moreover, at the time of detecting the latent image of the resist or the image of the alignment mark, the accurate mark position can be acquired, thus ensuring high-precision alignment exposure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 15 is a flowchart for an electron beam exposure method according to a fourth embodiment of this invention;

FIG. 19 is a transverse cross-sectional view showing the detailed structure of a sample to be used in electron beam exposure according to this embodiment;

FIG. 20 is a flowchart for an electron beam exposure method according to this embodiment;

FIG. 21 is a diagram for explaining how to apply a voltage to a sample according to this embodiment; and FIG. 22 is a diagram showing a deviation of a mark position with respect to a variation in applied voltage according to this embodiment.

DETAILED DESCRIPTION OF THE INVENTION

Preferred embodiments of this invention will now be described with reference to the accompanying drawings.

First Embodiment

Figure 6:
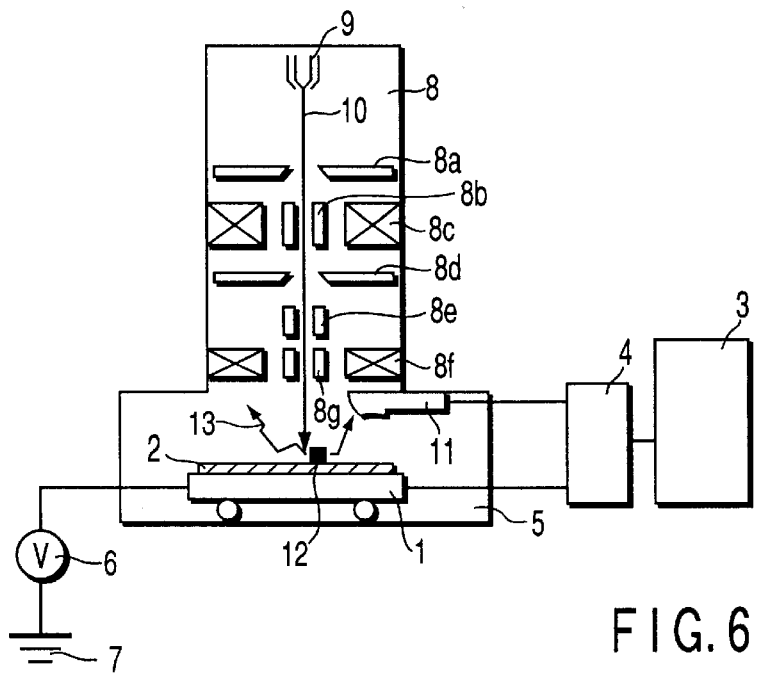
FIG. 6 is a diagram illustrating the general structure of an electron beam exposure apparatus according to a first embodiment of this invention.

FIG. 6 represents a diagram illustrating the general structure of an electron beam exposure apparatus according to the first embodiment of this invention.

In the diagram, reference numeral "1" denotes a stage on which a sample 2 is placed. The movement of the stage 1 is determined by exposure data and procedures which have previously been input. Specifically, a control computer 3 in which the exposure data and procedures have been input send control signals to a control circuit 4 under whose control the stage 1 is driven.

The stage 1 and the sample 2 are disposed in a sample chamber 5. Because the inside of this sample chamber 5 is kept in a vacuum stage, the stage 1 and the sample 2 are not influenced by particles. The end of the sample 2 is grounded to an earth 7 via a power supply 6 as voltage applying mechanism. A cylinder 8 is provided on the top of the sample chamber 5 with an electron gun 9 disposed in the cylinder 8. This electron gun 9 emits an electron beam 10 toward the sample 2. Disposed on the traveling path of the electron beam 10 in the cylinder 8 are a first aperture 8a, a deflector 8b, a second aperture 8d, a deflector 8e, and a deflector 8g in the name order along the traveling direction of the electron beam. The deflector 8b is surrounded with a projection lens 8c, and the deflector 8g is surrounded with an objective lens 8f. In the sample chamber 5, a detector 11 is located at a position where it faces the sample 2 and does not interfere with the traveling path of the electron beam 10 which reaches the sample 2. This detector 11 detects back-scattered electrons and secondary electrons 13 generated from an alignment mark 12 formed on the sample 2, and a scintillator, for example, may be used as the detector.

This electron beam exposure apparatus is of a type which continuously moves a stage and uses a variable shaped beam. In addition, the exposure apparatus involves two-stage (main and sub) electrostatic deflection. The acceleration voltage for exposure with the electron beam 10 is 5 kV, and the main deflection width is 1500 μm and the sub deflection size is 50 μm×50 μm. With this apparatus in use, if the thickness of the resist film is 0.15 μm or smaller, even the acceleration voltage of about 5 kV of the electron beam 10 emitted from the electron gun 9 can form a resist pattern having a perpendicular cross section. The acceleration voltage of the electron beam 10 being 5 kV means that the potential of the electron beam 10 at the emission position is −5 kV. That is, if the voltage to the sample 2 is 0 kV, the potential of the sample 2 is higher by 5 kV than the potential of the electron beam 10 at the emission position, so that electrons, which are negative-charged particles, are accelerated with a potential difference of 5 kV.

When the sample 2 is fed into the sample chamber 5, unillustrated exposure data and procedures are sent to the control circuit 4 via the control computer 3. Then, the electron beam 10 is irradiated to expose a desired pattern under the control of the control circuit 4. The power supply 6 as the voltage applying mechanism can apply a voltage to the sample 2 via the stage 1.

According to this embodiment, the applied voltage to the sample is ±10 kV. As the acceleration voltage of the electron beam 10 for exposure is 5 kV, when 10 kV is applied to the sample 2 from the power supply 6, the landing energy of the electron beam 10 to the sample 2 becomes 15 kV. That is, when the potential of the electron beam 10 at the emission position is −5 kV and the potential of the sample 2 is 10 kV, the voltage to the sample 2 becomes 15 kV with respect to the potential of the electron beam 10 at the emission position. If −4 kV is applied to the sample 2, the landing energy of the electron beam 10 to the sample 2 becomes 1 kV.

As the alignment mark 12 on the sample 2 is scanned with the electron beam 10, the secondary electrons and back-scattered electrons 13 are generated. As the generated secondary electrons and back-scattered electrons 13 are detected by the detector 11, the alignment mark 12 can be specified.

Figure 7:
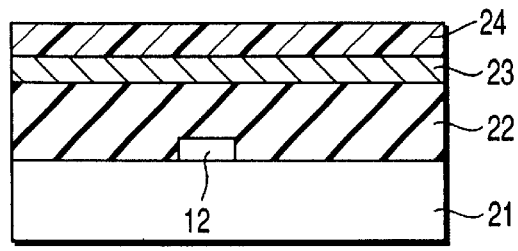
FIG. 7 is a cross-sectional view showing the detailed structure of a sample to be used in electron beam exposure according to this embodiment.

FIG. 7 shows the detailed structure of the sample 12 which is used in this embodiment. The alignment mark 12 of tungsten is formed on an Si substrate 21. An Si oxide film 22 is formed 1 μm thick on the Si substrate 21 having the mark 12 formed thereon. Polysilicon 23 with a thickness of 0.2 μm and a resist 24 with a thickness of 0.15 μm are further deposited on this Si oxide film 22. The polysilicon 23, like the Si substrate 21, is connected to the earth 7 via the power supply 6.

Figure 8:
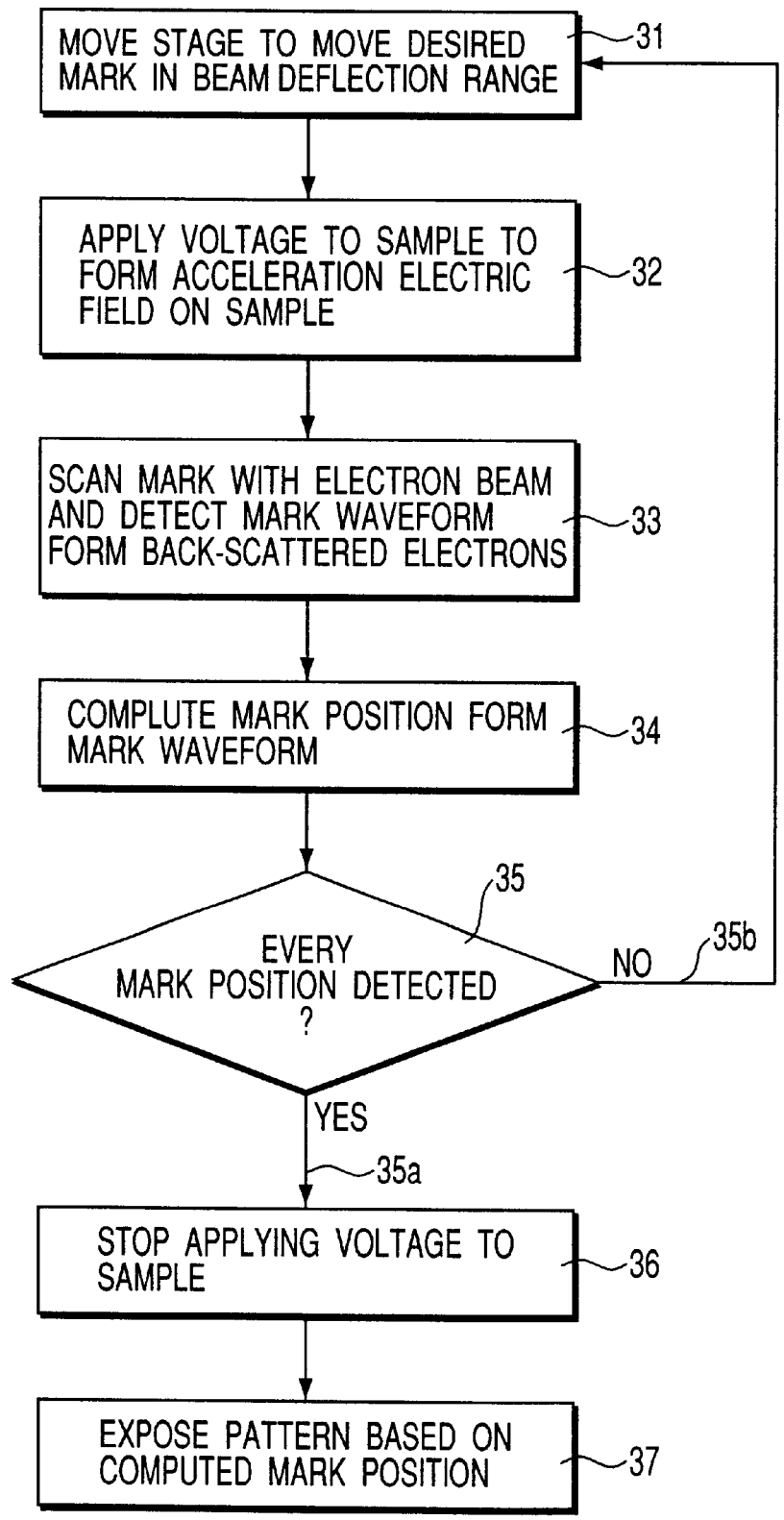
FIG. 8 is a flowchart for an electron beam exposure method according to this embodiment.

An electron beam exposure method according to this embodiment will now be described with reference to the flowchart in FIG. 8.

The position of the alignment mark 12 shown in FIG. 6 on the sample 2 has previously been input in the control computer 3 and the stage 1 is moved based on this positional information to move the alignment mark 12 directly under the beam (31). Then, a voltage of 10 kV is applied to the sample 2 by the power supply 6, thus forming an acceleration electric field on the sample 2 (32). The term "acceleration electric field" which will be used in the following description of the embodiments means an electric field which accelerates electrons having negative charges when a positive voltage is applied to the sample 2 to which no voltage has been applied.

Figure 9:
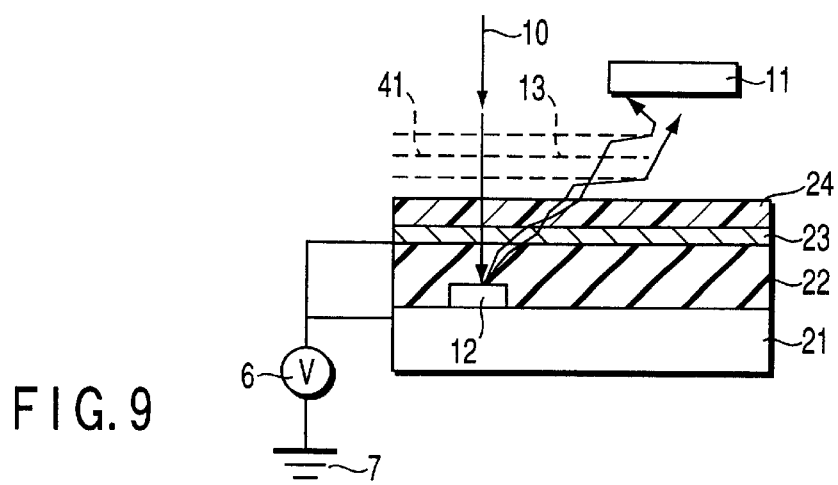
FIG. 9 is a diagram for explaining a mark detection method according to this embodiment.

As a thick film such as the Si oxide film 22 is formed over the alignment mark 12, a low-energy electron beam does not permit electrons to reach the alignment mark 12. At the time of detecting the alignment mark 12, therefore, a voltage is applied to the sample 2 to increase the landing energy to the sample 2. FIG. 9 shows mark detection near the sample 2 when a voltage of 10 kV is applied to the sample 2. As shown in FIG. 9, because the acceleration voltage is applied to the sample 2 by the power supply 6, an acceleration electric field 41 is produced above the Si substrate 21.

Accordingly, when the voltage of the incident electron beam 10 is 5 kV or the potential of the electron beam 10 at its emission position is −5 kV, the landing energy to the sample 2 becomes 15 kV. The range of the electrons of the 15-kV electrons in Si is about 3 μm. As a result, the electron beam 10 can reach the underlying alignment mark 12 so that the back-scattered electron signal from the mark 12 can be acquired, thus ensuring detection of the mark position.

Figure 1:
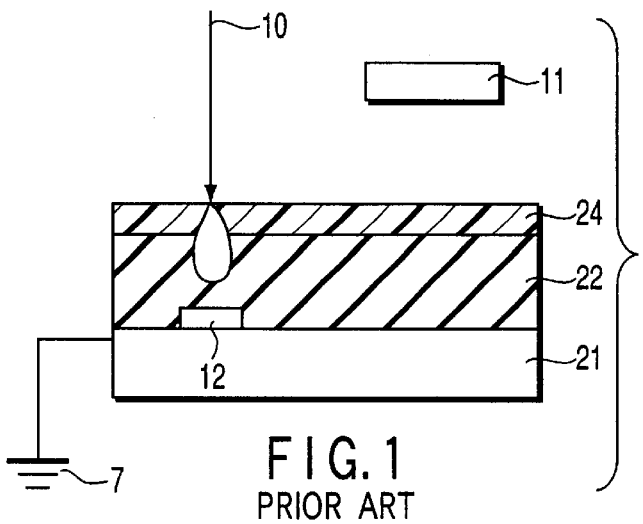
FIG. 1 is a diagram for explaining a conventional mark detection method using a low-energy electron beam.
Figure 2:
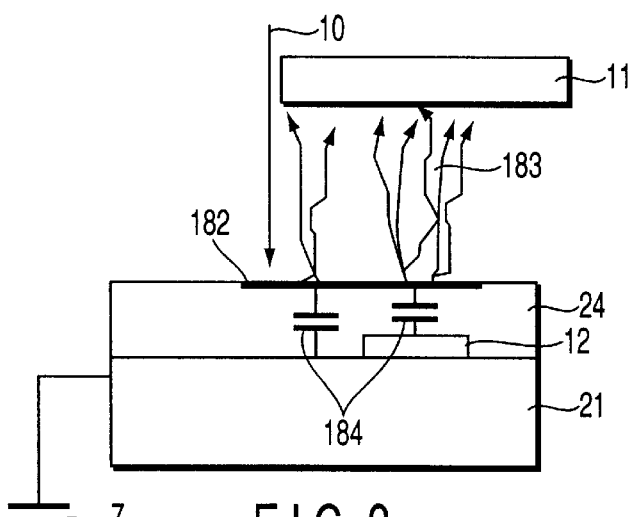
FIG. 2 is a diagram illustrating a conventional alignment-pattern detection method.
Figure 4:
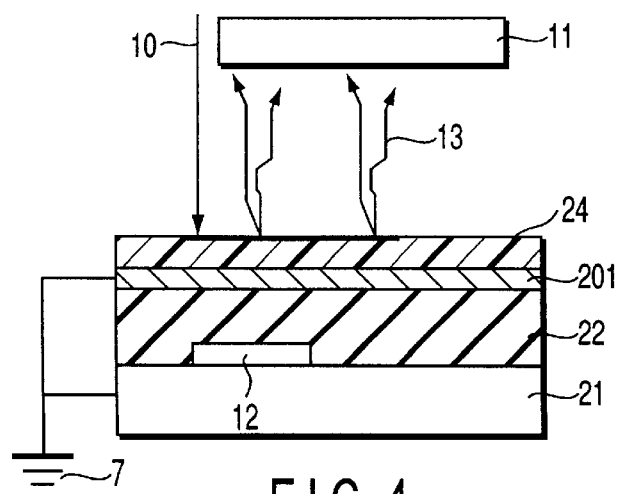
FIG. 4 is a diagram showing an electron beam exposure method proposed to overcome the conventional charge-up problem.
Figure 3A:
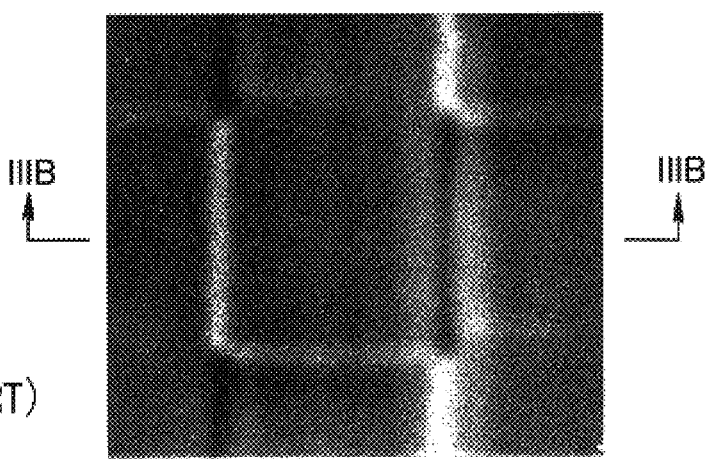
FIG. 3A is a microphotograph showing the pattern image of an alignment mark detected by this conventional alignment-pattern detection method.
Figure 3B:
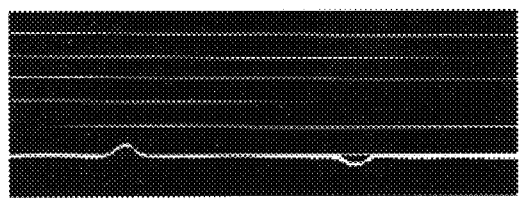
FIG. 3B is a microphotograph showing the detected waveform of the alignment mark detected by this conventional alignment-pattern detection method.
Figure 10A:
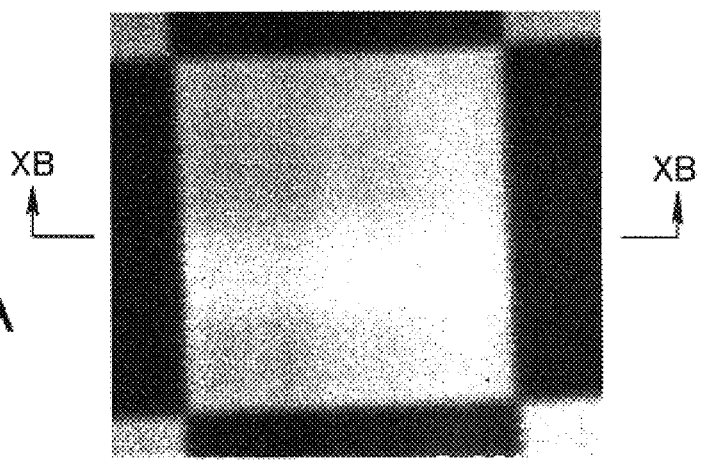
FIG. 10A is a microphotograph showing the pattern image of an alignment mark according to the electron beam exposure method according to this embodiment.
Figure 10B:
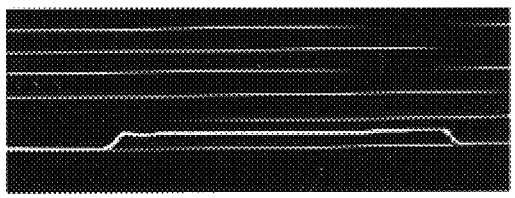
FIG. 10B is a microphotograph showing the detected waveform of the alignment mark according to the electron beam exposure method according to this embodiment.

As shown in FIG. 9, the electron beam 10 is scanned over the alignment mark 12 and the secondary electrons and back-scattered electrons 13 generated from the mark 12 are detected by the detector 11. The signal waveform detected by the detector 11 is sent via the control circuit 4 shown in FIG. 6 to the control computer 3 where the mark position is computed (33). FIG. 10A shows a mark image obtained here and FIG. 10B shows an acquired mark waveform.

The above-described steps from the movement of the stage 11 to the computation of the mark position are repeated for each alignment mark 12. When all the mark positions are detected (35a), voltage application to the sample 2 is stopped (36). Then, the sample 2 is grounded to set the landing energy back to that for the same landing energy as used in the actual pattern exposure. When all the mark positions are not detected, the flow returns to the stage-moving step 31 to detect an undetected mark position (35b) so that a different alignment mark 12 is detected.

When all the mark positions are detected (35a), voltage application to the sample 2 is stopped to thereby set the landing energy back to the level for the same landing energy as used in the actual pattern exposure in this embodiment. While the voltage of 10 kV was applied to the sample 2 at the time of detecting the alignment mark 12, the voltage to be applied the sample 2 is set to zero to execute pattern exposure, thus setting the landing energy for pattern exposure to 5 kV.

Next, pattern exposure is carried out with the landing energy of 5 kV based on the positional information of the alignment mark 12 acquired in the above-described steps (37).

According to this embodiment, the electron beam is accelerated by an acceleration electric field which is generated on a sample by applying a voltage to the sample. This can permit an alignment mark located deep from the sample surface to be detected even with a low-energy electron beam. As back-scattered electrons are detected, the mark can be detected even when the conductive polysilicon 23 is located under the resist 24.

At the time of carrying out pattern exposure, the voltage to be applied to the sample 2 is made lower or killed to reduce the landing energy to the sample 2. This can result to an improved resist sensitivity as well as suppression of the proximity effect at the time of pattern exposure, thereby improving the exposure throughput.

It is to be noted that this invention is in no way limited to the fundamental structure of the sample 2 shown in FIG. 7. Although conductive polysilicon is used under the resist, this invention can be adapted to a case where a conductive film is formed on the resist. Although the alignment mark is formed of tungsten in this embodiment, the material for the alignment mark is not limited to this particular material according to this invention. This invention can of course be adapted to a case where the alignment mark is formed of another material like polysilicon.

In addition, this invention is not limited by the acceleration voltage. Although the acceleration voltage is set to 5 kV in the above-described embodiment, a low-energy electron beam with the landing energy of 5 kV or lower may be used at the time of pattern exposure. Likewise, this invention can be adapted to a case where pattern exposure is implemented with the landing energy of over 5 kV.

Further, this invention is not limited by the applied voltage to a sample. Although the applied voltage is set to 10 kV in this embodiment, an applied voltage of a different level may well be used as long as the electron beam reaches the alignment mark.

Second Embodiment

This embodiment is a modification of the first embodiment which corrects the mark position obtained by the first embodiment.

Figure 12A:
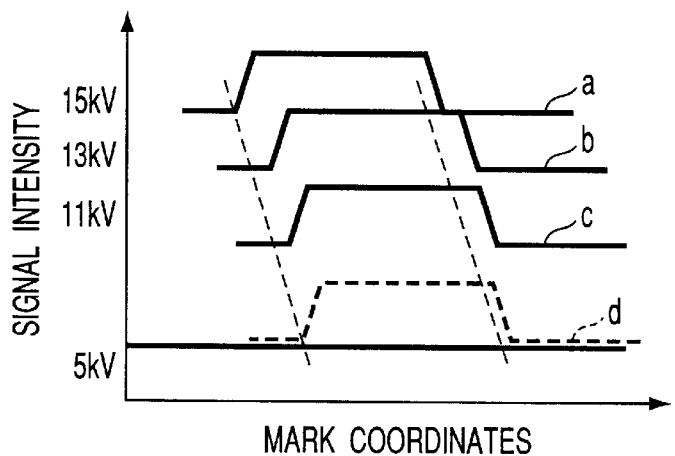
FIG. 12A is a diagram showing a relationship between mark coordinates and a signal intensity according to this embodiment.
Figure 12B:
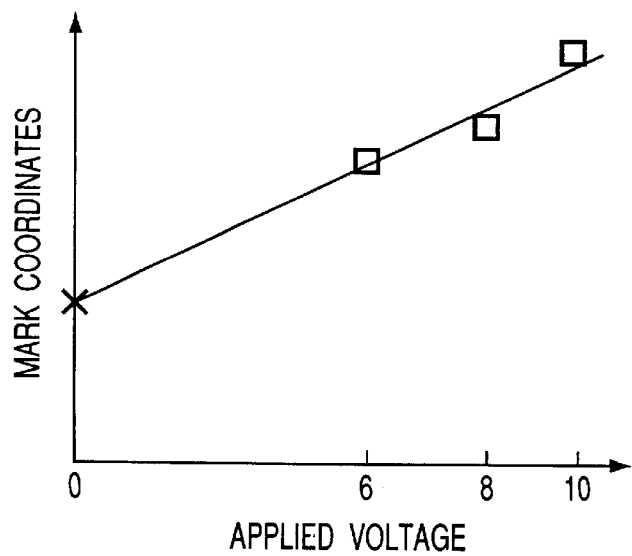
FIG. 12B is a diagram showing a relationship between an applied voltage and mark coordinates according to this embodiment.
Figure 11:
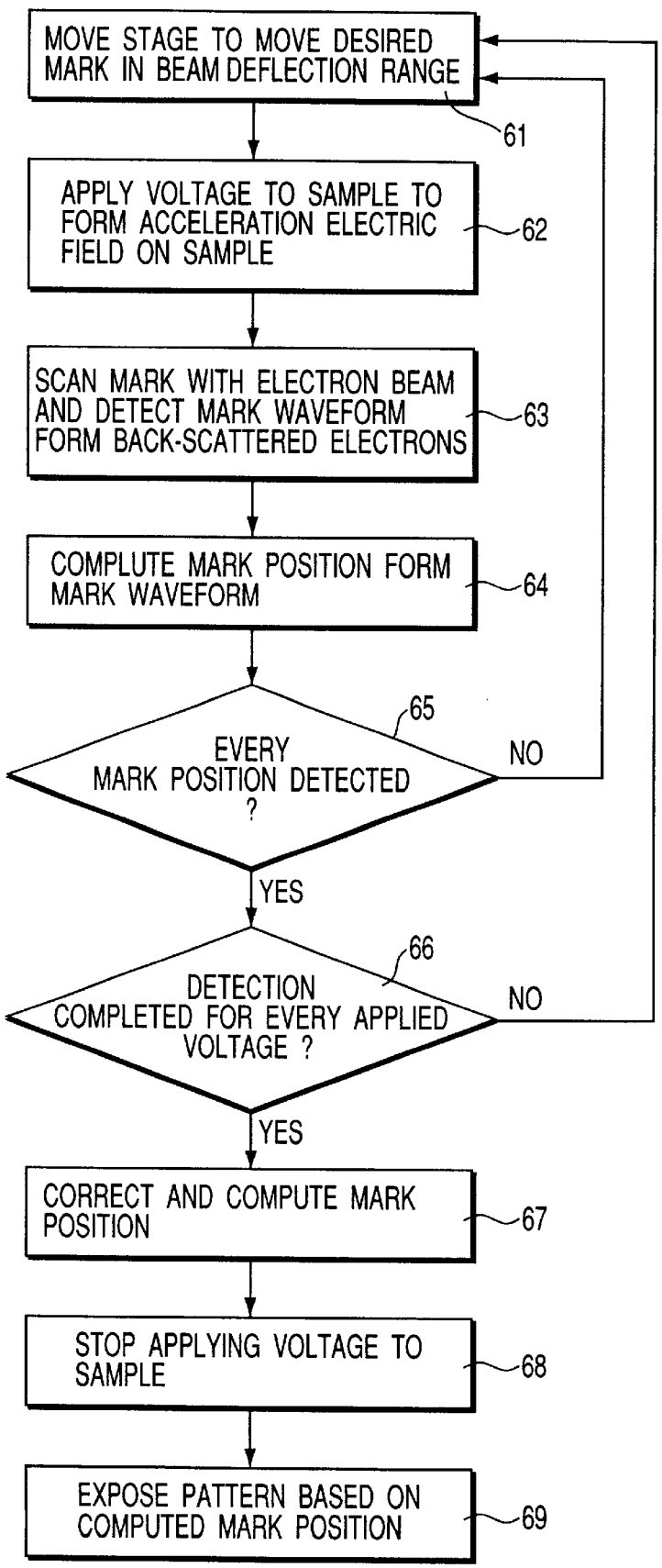
FIG. 11 is a flowchart for an electron beam exposure method according to a second embodiment of this invention.

FIGS. 11, 12A and 12B are diagrams for explaining an electron beam exposure method according to this embodiment. FIG. 11 is a flowchart for the electron beam exposure method according to this embodiment, which takes almost the same structure as that of the first embodiment. Note that the electron beam exposure apparatus shown in FIG. 6 and the sample 2 shown in FIG. 7 are used as per the first embodiment. The detailed description of those portions which are the same as corresponding portions of the first embodiment will not be given in the following description of the second embodiment. According to this embodiment, alignment is implemented along the flow illustrated in FIG. 11 while applying different voltages to the sample 2.

This embodiment will now be described with reference to the flowchart in FIG. 11.

First, the stage 1 is moved based on the position of the alignment mark on the sample 2 that has previously been given to the control computer 3, thereby moving the mark to the center of the deflection region (61). Then, a voltage of 10 kV is applied to the sample 2 by the power supply 6, thus forming an acceleration electric field on the sample 2 (62). As the acceleration voltage of the incident electron beam 10 is 5 kV, the landing energy to the sample 2 becomes 15 kV.

Next, the alignment mark 12 is scanned with the electron beam 10 for detection of the mark position (63). Based on the acquired detected waveform, the control computer 3 computes the mark position (64).

The above-described steps 61 to 64 are performed for each alignment mark 12 and when all the mark positions are detected, the flow proceeds to the next step. When there is any undetected alignment mark 12, the flow returns to the step 61 (65).

When the positions of all the alignment marks are detected, the applied voltage to the sample 2 is switched to 8 kV from 10 kV and mark position detection is carried out. As the acceleration voltage of the incident electron beam 10 is 5 kV, the landing energy to the sample 2 becomes 13 kV. With this voltage applied, the aforementioned steps 61 to 64 are repeated, and when all the mark positions are detected, the applied voltage is changed to another different one.

Specifically, the applied voltage to the sample 2 is switched to 6 kV under which mark position detection is implemented. As the acceleration voltage of the incident electron beam 10 is 5 kV, the landing energy to the sample 2 becomes 11 kV.

If the sample 2 is tilted to the surface of the objective lens, the mark position detected with the applied voltage to the sample 2 is shifted. FIG. 12A is a diagram showing detected waveforms of a mark, with the horizontal scale representing the mark coordinates while the vertical scale represents the intensities of signals. In FIG. 12A, "a" to "d" are respectively the detected waveforms of a mark for the applied voltages of 10 kV, 8 kV, 6 kV and 0 kV; the waveforms a to c are what is acquired from the actual measurement and the waveform d is what is predicted based on the waveforms a to c. As shown in FIG. 12A, since the voltages to be applied to the sample 2 are 6 kV, 8 kV and 10 kV in this embodiment, the landing energies respectively become 11 kV, 13 kV and 15 kV. It is apparent from the signal waveforms of the landing energies that there are deviations among the mark coordinates when compared with one another. Those deviations occur because the voltage is applied to the sample 2 while the sample 2 is tilted to the objective lens, and are originated from the non-uniform electric field generated between the sample and the objective lens. In this case, the exposure pattern may be misaligned with the base pattern when pattern exposure is carried out. When such misalignment occurs, it is necessary to correct the mark position in such a manner that the landing energy of the electron beam at the time of detecting the alignment mark matches with the landing energy at the time of executing pattern exposure.

FIG. 12B is a diagram for explaining how to correct the mark position and shows a graph obtained by plotting the mark coordinates acquired in the above step. The horizontal scale in this diagram represents the applied voltage to the sample 2, and the vertical scale the mark coordinates. The mark coordinates acquired in the above step are plotted on the coordinate system and mark coordinates in a case where the applied voltage for pattern exposure is applied after linear interpolation are calculated. Because the voltage to be applied to the sample 2 at the time of pattern exposure is 0 kV in this embodiment, the mark coordinates when the applied voltage to the sample 2 is 0 kV should be acquired. In FIG. 12B, therefore, the mark "X" indicates the mark coordinates at the time of pattern exposure.

Thereafter, a work of setting the landing energy back to 5 kV, the same level as used in the actual pattern exposure, is performed. This work will end as the voltage applied to the sample 2 is set to zero in the above-described mark position detecting steps (61–66).

Then, pattern exposure is executed with the landing energy of 5 kV based on information of the mark position acquired after correction.

According to this embodiment, as discussed above, different voltages are applied to the sample 2 and the mark position is detected on each applied voltage. Accordingly, it is possible to correct the deviation of the electron beam 10 with respect to the sample 2 which depends on the electric field that acts on the sample 2 and the surface of the objective lens.

Even if the mark position is deviated when the voltage is applied to the sample 2 which is tilted to the objective lens, for example, it is possible to acquire the precise mark position at the time of executing pattern exposure.

Third Embodiment

This embodiment is another modification of the first embodiment which is characterized in that after the mark position is obtained in the first embodiment, the alignment pattern is further exposed and the position of this alignment pattern is detected with the same landing energy as used at the time of pattern exposure.

Figure 13:
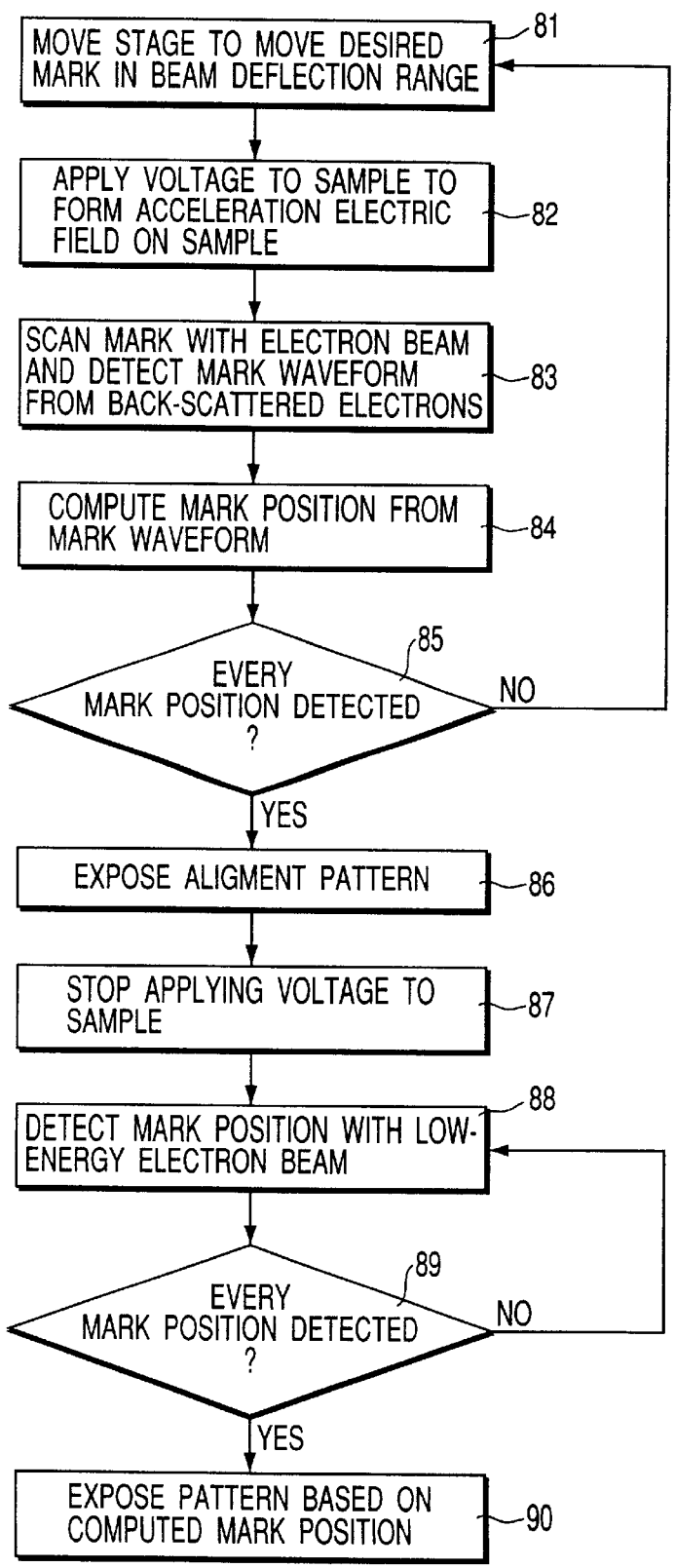
FIG. 13 is a flowchart for an electron beam exposure method according to a third embodiment of this invention.
Figure 14A:
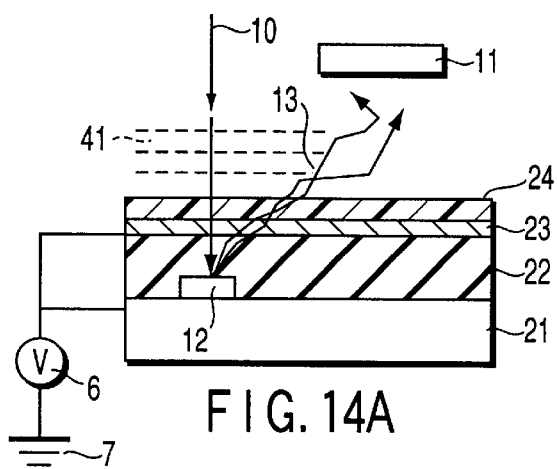
FIGS. 14A through 14C are diagrams illustrating the operation of the electron beam exposure method according to this embodiment.
Figure 14B:
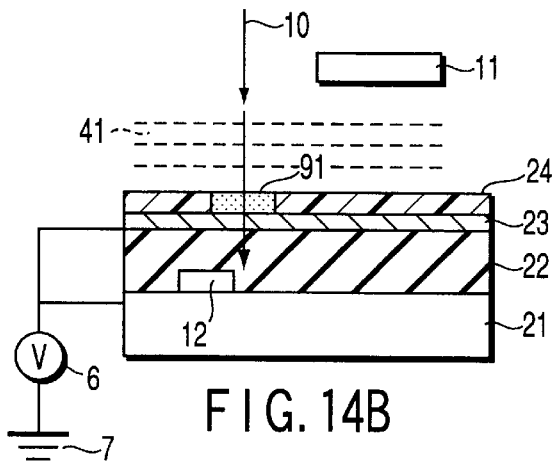
Figure 14C:
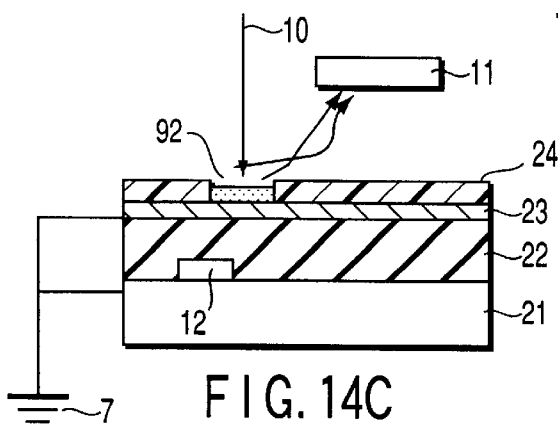

FIGS. 13, 14A, 14B and 14C are diagrams for explaining an electron beam exposure method according to this embodiment. FIG. 13 is a flowchart for the electron beam exposure method according to this embodiment, and FIGS. 14A–14C are diagrams illustrating the operation of the exposure method. According to this embodiment, as in the first and second embodiments, the electron beam exposure apparatus shown in FIG. 6 and the sample 2 shown in FIG. 7 are used and different voltages are applied to the sample 2 to detect the position of a base alignment mark. This embodiment will now be described with reference to the flowchart in FIG. 13.

First, the stage 1 is moved based on the position of the alignment mark on the sample 2 that has previously been given to the control computer 3, thereby moving the alignment mark 12 to the center of the beam deflection region (81). Then, a voltage of 10 kV is applied to the sample 2 by the power supply 6 (82). As the acceleration voltage of the incident electron beam 10 is 5 kV, the landing energy to the sample 2 becomes 15 kV. Next, the alignment mark 12 is scanned with the electron beam 10 for detection of the mark position (83). Based on the acquired detected waveform, the control computer 3 computes the mark position (84). The above-described procedures are performed for every alignment mark 12 (85). The operation up to this stage is the same as that in the first or second embodiment and is carried out by an apparatus shown in FIG. 14A. This embodiment further uses an alignment pattern as shown in FIGS. 14B and 14C.

Then, an alignment pattern 91 is exposed on the resist 24 above the mark 12 or in the vicinity thereof based on the computed alignment mark position while the voltage is applied to the sample 2 as shown in FIG. 14B (86). Even if the sample 2 is tilted to the objective lens and a non-uniform electric field is generated between the sample 2 and the objective lens, the position of the alignment pattern 91 does not deviate from the position of the base mark 12 if the landing energy to the sample 2 at the time of detecting the alignment mark is equal to the landing energy at the time of pattern exposure.

Exposure of this alignment pattern 91 is performed for all the alignment marks. The exposure causes the resist in the exposed alignment pattern portion to have a degassing reaction, thus forming a dent 92. When energy rays are irradiated onto a 2-component resist consisting of poly(t-boc styrene) and onium salt, for example, an acid produced from the onium salt by the energy rays decomposes the t-butoxycarboxy group of the side chain of polymer into a hydroxyl group and $CO_2$ and $C_4H_8$ are produced.

AS electron beam exposure is executed in vacuum, degassing forms the dent 92 without performing a heat treatment after exposure if exposure is implemented with a sufficient exposure dose. As the depth of the dent 92 becomes approximately 10% of the resist film thickness of 0.15 $\mu$m, a dent pattern with a depth of 15 nm can be formed. As this dent or step of the alignment pattern is scanned with a landing energy as large as that for pattern exposure, the mark position can be detected.

Thereafter, a work of setting the landing energy back to 5 kV, the same level as used in the actual pattern exposure, is performed (87). While the voltage of 10 kV is applied to the sample 2 in the above-described mark detection and alignment pattern exposure, this work will be completed as the voltage applied to the sample 2 is set to zero.

Next, the dent 92 formed in the alignment pattern 91 is scanned with the electron beam 10 having the landing energy of 5 kV to detect the position of the alignment pattern 91 (88). When the dent 92 or step in the alignment pattern 91 is scanned with the electron beam 10, the beam scanning itself exposes the resist, forming a dent or step. Because a sufficient exposure dose is needed to form the dent 92 formed in the exposed resist portion, however, it is actually possible to detect the position of the step or dent 92 of the alignment pattern 91 alignment pattern 91 before the step or dent 92 is formed by the scanning with the electron beam 10. As the dent 92 or step in the alignment pattern 91 is formed in the surface of the sample 2, the mark position can be detected through scanning with the same low landing energy as used for pattern exposure.

The mark position is computed in the same way as done in the operation of detecting the alignment mark 12. After the positions of all the alignment patterns 91 formed on the sample 2 are detected (89), pattern exposure is carried out with the landing energy of 5 kV based on this positional information (90).

According to this embodiment, the landing energy of the electron beam at the time of pattern exposure is the same as the landing energy of the electron beam at the time of alignment, so that the deviation of the electron beam with respect to the sample 2 which depends on the electric field that acts on the sample 2 and the surface of the objective lens does not occurs. Even if the mark position is shifted when the voltage is applied to the sample 2 which is tilted to the objective lens, for example, it is possible to acquire the precise mark position at the time of executing pattern exposure.

Fourth Embodiment

This embodiment is another modification of the third embodiment which is characterized in that the mark position is detected by detecting a latent image on the resist.

FIG. 15 is a flowchart for an electron beam exposure method according to this fourth embodiment. In this embodiment, the same electron beam exposure apparatus and sample 2 as used in the first embodiment are used. In this embodiment, mark detection is performed with the landing energy to the sample 2 increased by applying a voltage to the sample 2. After the mark position is detected, the alignment pattern is exposed on the resist above the mark or in the vicinity thereof with the large landing energy. An operation for detecting the mark position will be discussed below with reference to FIG. 15 and FIGS. 16A to 16C.

Figure 16A:
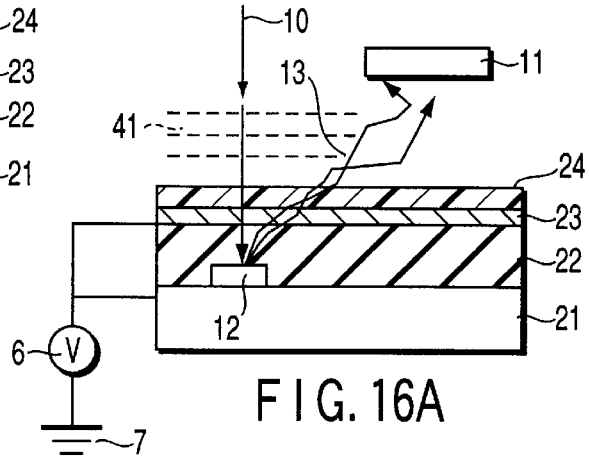
FIGS. 16A through 16C are diagrams illustrating the operation of the electron beam exposure method according to this embodiment.
Figure 16B:
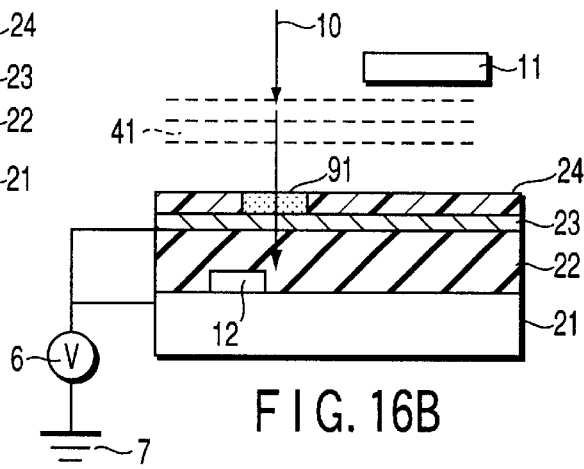

First, the stage 1 is moved based on the position of the alignment mark on the sample 2 that has previously been given to the control computer 3, thereby moving the alignment mark 12 to the center of the beam deflection region (101). Then, as shown in FIG. 16A, a voltage of 10 kV is applied to the sample 2 by the power supply 6, thereby forming an acceleration electric field 41 on the sample 2 (102). As the acceleration voltage of the incident electron beam 10 is 5 kV, the landing energy to the sample 2 becomes 15 kV. Next, the alignment mark 12 is scanned with the electron beam 10 for detection of the mark position (103). Based on the detected waveform,. the control computer 3 computes the mark position (104). The above-described procedures are performed for every alignment mark 12 (105). Then, the alignment pattern 91 is exposed on the mark 12 based on the computed mark position as shown in FIG. 16B (106).

The above procedures are common to those of the third embodiment. The subsequent steps will be executed in this embodiment as follows.

Figure 16C:
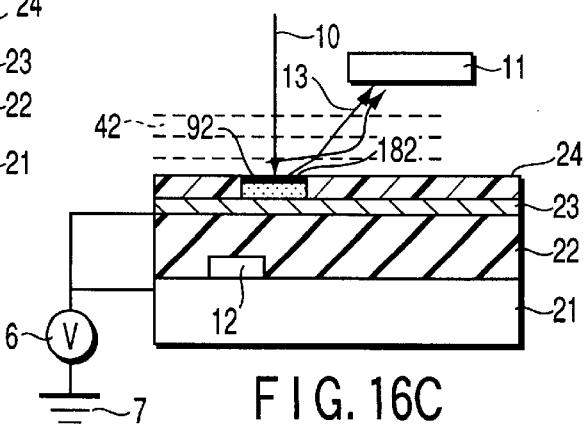

A voltage of 4 kV whose sign is opposite to that of the applied voltage in the above operation is applied to the sample 2 to set the landing energy to the sample 2 to 1 kV (107). With a deceleration electric field 42 generated, the latent image of the exposed alignment pattern 91 is detected with the electron beam 10 having the landing energy of 1 kV as shown in FIG. 16C (108). The latent image is detected by using the step formed between the exposed portion and unexposed portion of the resist 24 and a difference in capacitance contrast between those portions. It is known that when a chemical amplification type resist as used in this embodiment is used, the conductivity of the exposed portion of the resist is changed by exposure (Spring in 1998: 45th Applied Physics Association Proceeding, No. 2, 28a-SZD-6 "Effect of Suppressing Charging of Chemical Amplification Type Resist Using Ionic Acid Generator" by Nakasugi et al.). That is, the conductivity of the resist 24 at the exposed portion of the alignment pattern is improved by exposure. In the case of the resist 24 used in this embodiment, the surface resistance was dropped by exposure to $10^{12}$ Ω from $10^{17}$ Ω. This produces a capacitance contrast between the exposed portion and unexposed portion of the alignment pattern.

The difference in capacitance contrast leads to different efficiencies of emission of secondary electrons at the individual portions, so that the base structure can be observed. As the deceleration electric field 42 is used here, only the resist surface 182 is exposed by the electron beam 10. This makes it hard for a dent or step to be formed by the scanning with electron beam 10 which has been discussed in the foregoing section of the third embodiment. It is therefore possible to observe a mark image similar to the one shown in FIGS. 10A and 10B. After the position of every alignment pattern 91 formed on the sample 2 is detected (109), pattern exposure is carried out based on the acquired mark position information (110).

When thick films like those indicated by "22" to "24" are formed on the alignment mark 12 formed on the base of the sample 2, electrons of a low-energy electron beam do not reach the mark 12. According to this invention, however, a voltage is applied to the sample 2 at the time of detecting the alignment mark to increase the landing energy to the sample 2, and mark detection and exposure of the alignment pattern are carried out under this condition.

As a result, the mark position can be detected by detecting the latent image on the resist. If the mark position is deviated by the voltage applied to the sample 2, the accurate mark position can be acquired by executing mark detection with different applied voltages to correct the mark position as done in the second embodiment.

Fifth Embodiment

This embodiment is a modification of the third and fourth embodiments which is characterized in that misalignment is measured before developing the resist.

Figure 17A:
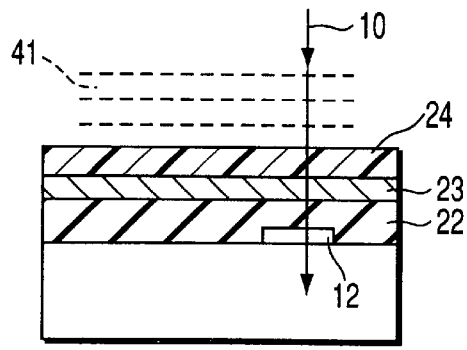
FIGS. 17A through 17D are diagrams illustrating the operation of an electron beam exposure apparatus according to a fifth embodiment of this invention.
Figure 17B:
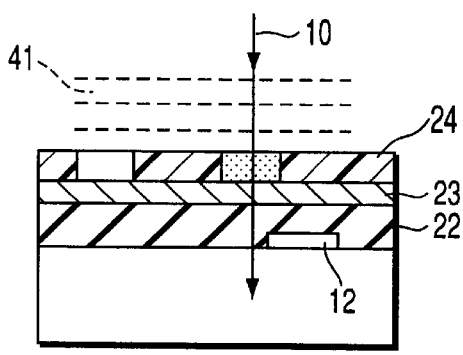
Figure 17C:
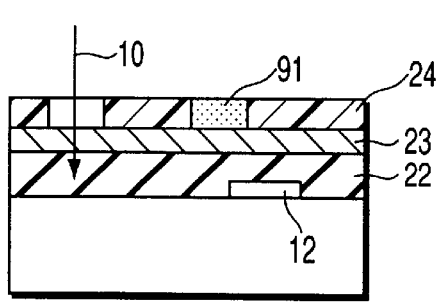
Figure 17D:
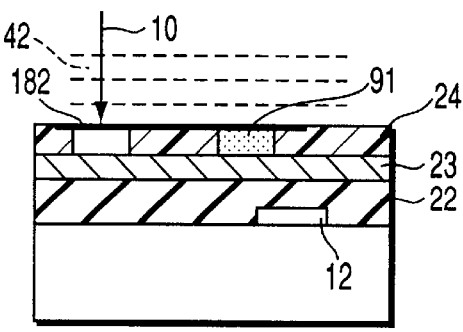

FIGS. 17A through 17D are diagrams for explaining an electron beam exposure apparatus according to this embodiment. Those diagrams illustrate a case where mark detection and exposure of the alignment pattern are carried out in the same way as done in steps 81 to 86 in the third embodiment (FIGS. 17A and 17B).

First, with an acceleration electric field generated, the alignment pattern 91 is exposed (FIG. 17B) based on the detected position of the alignment mark 12 (FIG. 17A). The flow up to this point is the same as that of the third embodiment.

Next, the position of the alignment pattern 91 is detected, after which a desired pattern 92 is exposed with the landing energy of 5 kV based on the detected information (FIG. 17C), and then a relative misalignment of the alignment pattern 91 and the desired pattern 92 is measured (FIG.

17D). In measuring the misalignment, the deceleration electric field 42 is generated on the sample 2 and only the resist surface 182 is scanned with the electron beam 10 to detect the latent image in the resist 24.

Through the above-described steps, misalignment of the exposure pattern can be measured before developing the resist 24. If a predetermined tolerance range has been determined previously, only the sample 2 that matches with the tolerance range is sent to the developing step after exposure and any sample 2 that does not match with the tolerance range is subjected to pattern exposure again in this measurement of misalignment, a wasteful process can be eliminated, thus leading to an improved productivity.

Sixth Embodiment

The feature of this embodiment lies in that inclination of a sample is corrected by applying different voltages to the sample to detect the mark position that varies.

Figure 18:
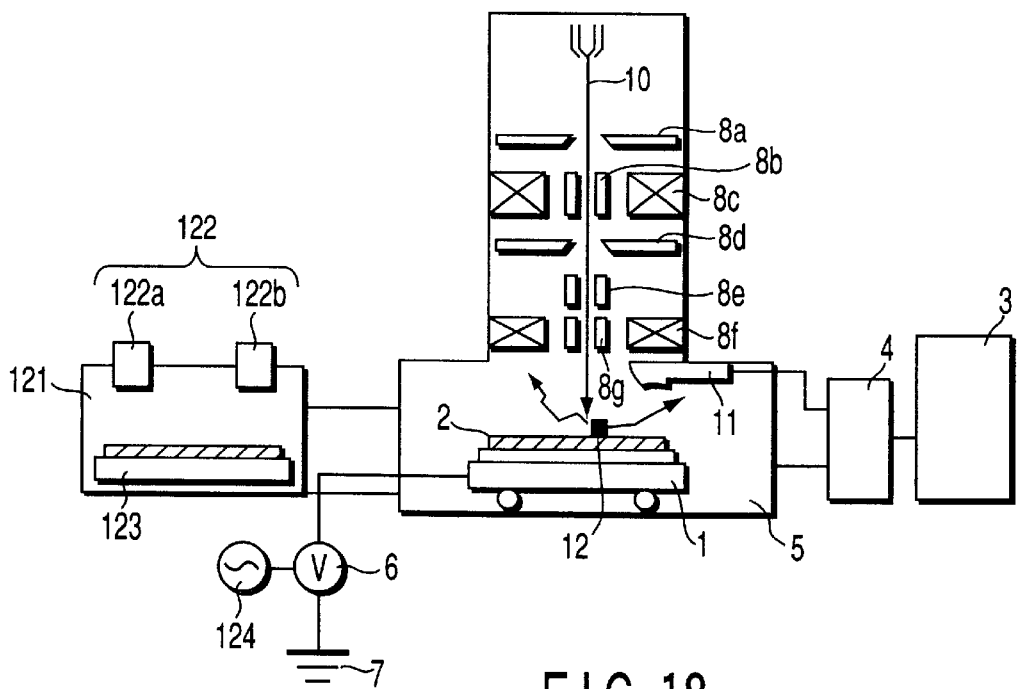
FIG. 18 is a diagram illustrating the general structure of an electron beam exposure apparatus according to a sixth embodiment of this invention.

FIG. 18 is a diagram illustrating the general structure of an electron beam exposure apparatus according to this embodiment. The structure of the electron beam exposure apparatus of this embodiment from the stage 1 to the alignment mark 12 is the same as that of the first embodiment shown in FIG. 6. This electron beam exposure apparatus is of a type which continuously moves a variable shaped stage and involves two-stage (main and sub) deflection. The acceleration voltage of this apparatus is 5 kV, and the main deflection width is 1500 $\mu$m and the sub deflection size is 50 $\mu$m×50 $\mu$m.

Reference numeral "121" denotes a secondary chamber where the inclination of the sample 2 is adjusted. Reference numeral "122" is a tilt measuring unit for measuring the tilt of the sample 2, and reference numeral "123" is a tilt adjusting mechanism adjusting the tilt of the sample and holding the sample. Reference numeral "124" is an AC power supply which continuously changes the applied voltage to the sample.

The functions of the individual sections will now be discussed. The sample 2 is first fed onto the adjusting mechanism 123 in the secondary chamber 121. The tilt measuring unit 122, which comprises a laser-beam irradiating section 122a and a light receiving section 122b, irradiates the laser beam from the irradiating section 122a onto the sample surface and reads the position of the reflected laser beam at by the light receiving section 122b to thereby measure the tilt of the sample surface.

The tilt adjusting mechanism 123 has a piezoelectric element for adjusting the tilt of the sample surface based on tilt of the sample surface and can adjust tilt of the sample 2 according to a reference plane set previously. The sample 2 whose tilt has been adjusted by the adjusting mechanism 123 is fed together with the adjusting mechanism 123 on the stage 1 in the sample chamber 5.

The power supply 6 applies a voltage to the sample 2 via the stage 1. The voltage applicable by this power supply 6 is ±10 kV. As the acceleration voltage of the incident electron beam 10 for exposure is 5 kV, the landing energy of the electron beam 10 to the sample 2 becomes 0.5 kV, if −4.5 kV is applied to the sample 2 by the power supply 6. The AC power supply 124 produces a voltage which varies within a range of ±200V. When the voltage applied to the sample 2 is 5 kV by the power supply 6, the use of the AC power supply 124 can continuously change the applied voltage within a range of 4.8 kV to 5.2 kV.

Unillustrated exposure data and mark position information corresponding to this exposure data are input to the control computer 3. The exposure data and mark position information are sent to the control circuit 4. Based on the sent mark position information, the stage 1 is moved, moving the alignment mark 12 formed on the sample 2 into the deflection region of the electron beam 10 for detection of the mark position. The mark position is specified by causing the detector 11 to detect the secondary electrons and backscattered electrons 13 generated by scanning the mark 12 on the sample 2 with the electron beam 10.

The detailed structure of the sample 2 used in this embodiment is shown in FIG. 19. The alignment mark 12 of polysilicon is formed on the Si substrate 21. The Si oxide film 22 is formed 1-$\mu$m thick on the alignment mark 12 and the resist 24 is further formed on the Si oxide film 22 to a thickness of 0.15 $\mu$m.

An electron beam exposure method according to this embodiment will now be discussed with reference to the flowchart shown in FIG. 20.

First, the sample 2 is fed onto the tilt adjusting mechanism 123 in the secondary chamber 121. The laser-beam irradiating section 122a of the tilt measuring unit 122 irradiates a laser beam on the sample 2 and the reflected laser beam is received at the light receiving section 122b. As a result, the tilt of the sample surface is measured. Then, based on the result of measuring the tilt of the sample surface, the tilt of the sample 2 is adjusted with respect to the reference plane (141). Consequently, the sample surface becomes parallel to the unillustrated objective lens.

Then, the stage 1 is moved based on the mark position previously input to the control computer 3 to thereby move the alignment mark 12 into the beam deflection region (142). Then, a voltage is applied to the sample 2 by the power supply 6 (143). Specifically, a voltage of −4.5 kV is applied to the sample 2. As the acceleration voltage of the electron beam 10 is 5 kV, the landing energy of the electron beam 10 to the sample 2 becomes 0.5 kV.

Next, scanning with the electron beam 10 is performed to detect the mark position (144). When the electron beam 10 is scanned over the sample 2, the voltage contrast between the charged-up portion on the alignment mark 12 and the other portion is produced, causing a difference in emission efficiency of the secondary electrons. The mark position is detected by detecting the latent image of the alignment mark 12 using this difference in emission efficiency of the secondary electrons.

Next, the applied voltage to the sample 2 is changed while scanning the mark 12 with the electron beam 10 (145). FIG. 21 shows how the applied voltage to the sample 2 varies. The horizontal scale in this figure represents the time and the vertical scale shows the applied voltage. At the same time as application of the substrate voltage is enabled (151), the applied voltage rises to 4.5 kV and the mark position is detected when the applied voltage becomes stable at 4.5 kV (152). When detection of the mark position is finished, the applied voltage is pulsated to check the tilt of the sample surface (153). The voltage change caused by the AC power supply 124 is in a range of ±200V and has a sine wave, and the landing energy to the sample 2 changes between 0.3 kV and 0.7 kV.

Figure 5:
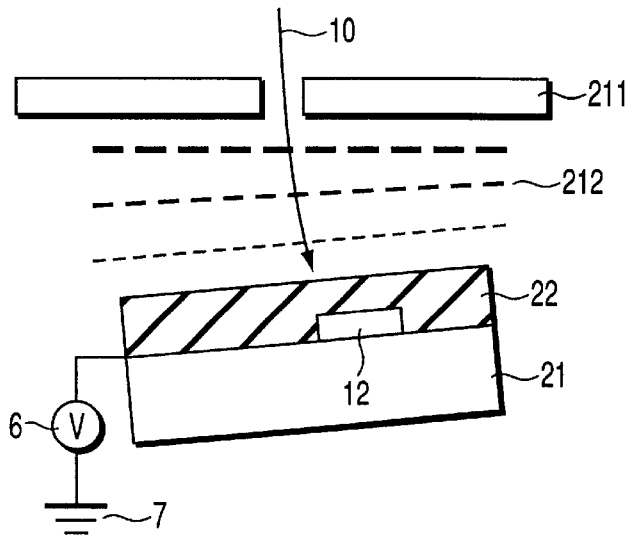
FIG. 5 is a diagram for explaining the conventional problem that arises from the inclination of a sample to the objective lens.

When the voltage is applied to the sample 2 with the sample 2 tilted to the objective lens, a non-uniform electric field is produced between the sample and the objective lens, changing the beam position as shown in FIG. 5. If the tilt of the sample to the objective lens is negligibly small and non-uniform electric field is not generated, the beam position and mark position are not changed by a variation in applied voltage to the sample 2.

FIG. 22 shows a variation in the position of the alignment mark 12 when the sample surface is tilted to the objective lens. In this figure, the horizontal scale shows the position, and the vertical scale the signal intensity with the mark coordinates indicated by the positions of the arrows. The solid line shows a case where the sample surface is not tilted and the broken line shows a case where the sample surface is tilted. It is apparent from this figure that the inclination of the sample surface results in a change in mark position. Here, the peak position of the alignment mark 12 is detected in synchronism with the periodic change in voltage. For example, the tolerance range for a variation in mark position is set to 5 nm.

When a change in mark position is detected and exceeds the set tolerance range, information on the positional change is fed back to the tilt adjusting mechanism and the above-discussed steps are repeated. When the change in mark position is equal to or smaller than the set tolerance value, detection of the mark position is executed (148). Based on the obtained mark position, alignment exposure is carried out (149).

According to this embodiment, as described above, a change in mark position can be detected by changing the applied voltage. When a change in mark position is detected, the tilt of the sample surface is readjusted so that this change in mark position falls within the tolerance range as discussed above.

This scheme can accurately correct the tilt or the like of the sample surface, resulting in high-precision pattern exposure. It is also possible to acquire the accurate mark position at the time of applying a voltage to the sample 2 to detect the latent image of the resist or the latent image of the base mark 12.

Although a change in mark position originated from a change in applied voltage to the sample 2 is checked for every alignment mark 12 in the above-described embodiment, a change in mark position may be checked with respect only to a pre-selected chip and mark. Such checking can shorten the time needed to detect the mark position.

This invention is not limited by the acceleration voltage. Although the landing energy at the time of pattern exposure is set to 5 kV in the above-described embodiment, a low-energy electron beam with the landing energy of 5 kV or lower may be used as well. Likewise, this invention can be adapted to a case where pattern exposure is carried out with the landing energy of over 5 kV.

Further, this invention is not limited to a case where a voltage is applied to the sample 2 at the time of pattern exposure. It is possible to execute pattern exposure by after applying a voltage to the sample 2 and then setting the desired landing energy to the sample 2. In this case as in the above-describe embodiment, the accurate mark position can be detected.

This invention is not limited to the type of an electron beam exposure apparatus. For instance, this invention may be applied to a partial full exposure type electron beam exposure apparatus, a variable shaped electron beam exposure apparatus, a multiple electron beam exposure apparatus, a round electron beam exposure apparatus, and a full exposure type electron beam exposure apparatus. It should be apparent to those skilled in the art that the present invention may be embodied in many other specific forms without departing from the spirit or scope of the invention.

Further, this invention is not limited to the case of the alignment exposure. This invention can be adapted to a case of testing a misalignment.

According to this invention, as elaborated above, as the landing energy of the charged beam to the sample is controlled according to the mode of alignment or pattern exposure by changing the voltage to be applied to the sample, high-precision alignment and exposure is possible with a simple system structure and without requiring a separate fast-accelerated charge-particle irradiating mechanism.

It is also possible to detect the tilt of the sample to the objective lens or a non-uniform electric field between the sample and the objective lens by detecting the alignment mark by changing the applied voltage to the sample and to correct the tilt based on the detection result. This can guarantee high-precision pattern exposure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged beam exposing method comprising the steps of:
   scanning an alignment mark formed in a sample with said charged beam which is accelerated by a charge-particle irradiating section and application of a first voltage to said sample for accelerating the charged beam emitted toward said sample thereby acquiring a position of said alignment mark, wherein the charged beam is more accelerated by application of a first voltage to said sample than when it is accomplished by application of a reference exposure voltage; and
   carrying out pattern exposure with the charged beam emitted from said charge-particle irradiating section, and accelerated by the charge-particle irradiating section and by application of said reference exposure voltage to said sample.

2. The charged beam exposing method according to claim 1, wherein said pattern exposure is performed based on information of said position of said alignment mark.

3. The charged beam exposing method according to claim 1, wherein said step of acquiring said position of said alignment mark comprises a step of applying at least two or more different voltages which allow said charged beam to reach said alignment mark to said sample, acquiring a position of said alignment mark for each of said applied voltages and acquiring a position of said alignment mark for said reference exposure voltage based on a relationship between said acquired positions of said alignment mark and said applied voltages; and
   said pattern exposure is to expose a pattern with said charged beam emitted from said charge-particle irradiating section based on said acquired position of said alignment mark for said reference exposure voltage.

4. The charged beam exposing method according to claim 1, further comprising, after acquisition of said position of said alignment mark, the steps of:
   applying said first voltage to said sample to expose an alignment pattern on said alignment mark or on said sample in a vicinity of said alignment mark, and
   applying said reference exposure voltage to said sample and scanning said alignment pattern with said charged beam emitted from said charge-particle irradiating section to thereby acquire a position of said alignment pattern; and wherein said pattern exposure is performed based on information of said position of said alignment pattern.

5. The charged beam exposing method according to claim 1, further comprising, after acquisition of said position of said alignment mark, the steps of:

applying said first voltage to said sample to expose an alignment pattern on said alignment mark or on said sample in a vicinity of said alignment mark, applying said reference exposure voltage to said sample and scanning said alignment pattern with said charged beam emitted from said charge-particle irradiating section to thereby acquire a position of said alignment pattern; and wherein said position of said alignment pattern is acquired by detecting a step between an exposed portion and an unexposed portion which is produced by a degassing reaction of a resist; and said pattern exposure is performed based on information of said position of said alignment pattern.

6. The charged beam exposing method according to claim 1, further comprising, after acquisition of said position of said alignment mark, the steps of:

applying said first voltage to said sample to expose an alignment pattern on said alignment mark or on said sample in a vicinity of said alignment mark, and applying a second voltage for decelerating said charged beam more than is accomplished by application of said reference exposure voltage to said sample and scanning said alignment pattern with said charged beam emitted from said charge-particle irradiating section to thereby acquire a position of said alignment pattern; and wherein said pattern exposure is performed based on information of said position of said alignment pattern.

7. The charged beam exposing method according to claim 1, further comprising, after acquisition of said position of said alignment mark, the steps of:

applying said first voltage to said sample to expose an alignment pattern on said alignment mark or on said sample in a vicinity of said alignment mark, applying said reference exposure voltage to said sample and scanning said alignment pattern with said charged beam emitted from said charge-particle irradiating section to thereby acquire a position of said alignment pattern, exposing a desired pattern with said charged beam emitted from said charge-particle irradiating section based on information of said position of said alignment pattern, and applying a second voltage for decelerating said charged beam more than is accomplished by application of said reference exposure voltage to said sample and scanning said alignment pattern and said desired pattern to thereby acquire a deviation between said position of said alignment pattern and a position of said desired pattern; and wherein said pattern exposure is performed based on information of said position of said alignment pattern.

8. The charged beam exposing method according to claim 1, wherein said charged beam is an electron beam; and said first voltage is a positive voltage.

9. The charged beam exposing method according to claim 1, wherein said reference exposure voltage is 0V.

10. The charged beam exposing method according to claim 1, further comprising, after acquisition of said position of said alignment mark, the steps of:

applying said first voltage to said sample to expose an alignment pattern on said alignment mark or on said sample in a vicinity of said alignment mark, and applying a second voltage for decelerating said charged beam more than is accomplished by application of said reference exposure voltage to said sample and scanning said alignment pattern with said charged beam emitted from said charge-particle irradiating section to thereby acquire a position of said alignment pattern; and wherein said pattern exposure is performed based on information of said position of said alignment pattern, and said charged beam is an electron beam; and a second voltage is a negative voltage.

11. A charged beam exposing method comprising:

a first step of applying a different voltage to a sample from a reference exposure voltage which is applied to said sample when a pattern exposure is carried out;

a second step of scanning said sample with a charged beam to thereby detect a position of an alignment mark formed in said sample;

a third step of changing an applied voltage to said sample;

a fourth step of detecting an amount of change in said position of said alignment mark cause by a change in said applied voltage; and a fifth step of adjusting a tilt of said sample based on said amount of change in said position of said alignment mark.

12. The charged beam exposing method according to claim 11, wherein said first to fifth steps are carried out at least once until said change in said position of said alignment mark falls within an allowable range.

13. The charged beam exposing method according to claim 12, wherein said third step of changing said applied voltage to said sample is a step of continuously or periodically changing said applied voltage.

* * * * *